United States Patent
Yamawaki et al.

(10) Patent No.: US 12,459,007 B2
(45) Date of Patent: Nov. 4, 2025

(54) SEPARATING APPARATUS AND SEPARATING METHOD

(71) Applicant: Tokyo Electron Limited, Tokyo (JP)

(72) Inventors: Yohei Yamawaki, Kumamoto (JP);
Seiji Nakano, Kumamoto (JP);
Yoshihiro Kawaguchi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 553 days.

(21) Appl. No.: 17/625,366

(22) PCT Filed: Jun. 29, 2020

(86) PCT No.: PCT/JP2020/025505
§ 371 (c)(1),
(2) Date: Jan. 7, 2022

(87) PCT Pub. No.: WO2021/006091
PCT Pub. Date: Jan. 14, 2021

(65) Prior Publication Data
US 2022/0266312 A1    Aug. 25, 2022

(30) Foreign Application Priority Data
Jul. 10, 2019  (JP) .................. 2019-128160

(51) Int. Cl.
*B08B 3/02*    (2006.01)
*B08B 1/12*    (2024.01)
(Continued)

(52) U.S. Cl.
CPC ............... *B08B 3/02* (2013.01); *B08B 1/12* (2024.01); *B08B 5/04* (2013.01); *B08B 13/00* (2013.01); *B08B 15/00* (2013.01)

(58) Field of Classification Search
CPC .... B08B 3/02; B08B 1/12; B08B 5/04; B08B 13/00; B08B 15/00; H01L 21/02;
(Continued)

(56) References Cited

U.S. PATENT DOCUMENTS

2019/0043740 A1    2/2019   Miyahara

FOREIGN PATENT DOCUMENTS

CN    109390252 A    2/2019
JP    2015032690 A   2/2015
(Continued)

OTHER PUBLICATIONS

WO 2019/176589 (Year: 2019).*
(Continued)

*Primary Examiner* — Alexander Markoff
(74) *Attorney, Agent, or Firm* — Shih IP Law Group, PLLC

(57) ABSTRACT

A separating apparatus configured to separate a processing target object into a first separation body and a second separation body includes a first holder configured to hold the first separation body; a second holder configured to hold the second separation body; a moving unit configured to move the first holder and the second holder relatively to each other; and a separation surface cleaning unit configured to clean at least a separation surface of the first separation body or a separation surface of the second separation body.

16 Claims, 20 Drawing Sheets

(51) Int. Cl.
    *B08B 5/04*           (2006.01)
    *B08B 13/00*         (2006.01)
    *B08B 15/00*         (2006.01)

(58) Field of Classification Search
    CPC . H01L 21/304; H01L 21/683; H01L 21/6835; H01L 21/67046; H01L 21/67051; H01L 2221/68386; H01L 21/67092; H01L 21/02057; H01L 21/67742; H01L 21/6838
    See application file for complete search history.

(56) References Cited

FOREIGN PATENT DOCUMENTS

| | | |
|---|---|---|
| JP | 2019-102676 A | 6/2019 |
| WO | 2013/058129 A1 | 4/2013 |

OTHER PUBLICATIONS

WO 2013/058129 (Year: 2013).*
JP 2015-99857 (Year: 2015).*
WO 2013/136982 (Year: 2013).*
International Search Report of PCT/JP2020/025505 dated Sep. 1, 2020.

* cited by examiner

FIG. 19
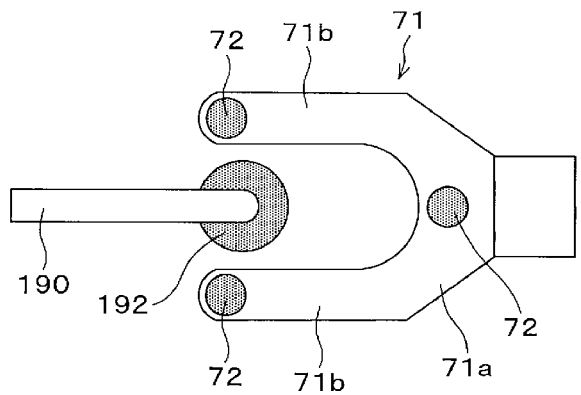
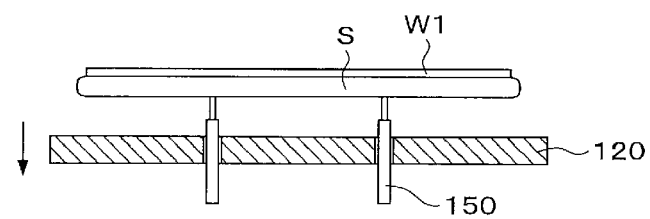
FIG. 20A
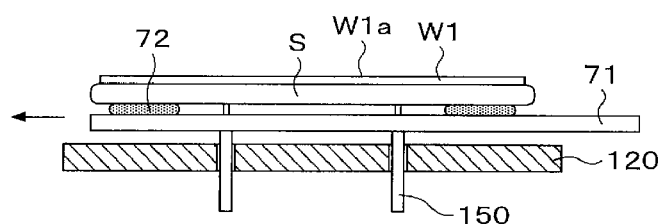
FIG. 20B
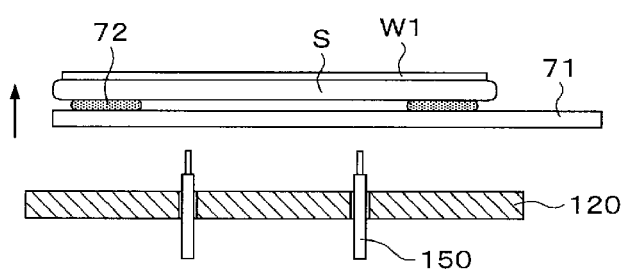
FIG. 20C

SEPARATING APPARATUS AND SEPARATING METHOD

CROSS-REFERENCE TO RELATED APPLICATIONS

This Application is a U.S. national phase application under 35 U.S.C. § 371 of PCT Application No. PCT/JP2020/025505 filed on Jun. 29, 2020, which claims the benefit of Japanese Patent Application No. 2019-128160 filed on Jul. 10, 2019, the entire disclosures of which are incorporated herein by reference.

TECHNICAL FIELD

The various aspects and embodiments described herein pertain generally to a separating apparatus and a separating method.

BACKGROUND

Patent Document 1 discloses a method of processing a stacked wafer in which a first wafer is stacked on top of a second wafer. In this processing method, a condensing point of a laser beam is set to be positioned inside the first wafer. By moving the first wafer horizontally relative to the condensing point while radiating the laser beam, a modification surface is formed within the first wafer. Then, a part of the first wafer is separated from the stacked wafer along the modification surface as a boundary.

PRIOR ART DOCUMENT

Patent Document 1: Japanese Patent Laid-open Publication No. 2015-032690

DISCLOSURE OF THE INVENTION

Means for Solving the Problems

In one exemplary embodiment, a separating apparatus configured to separate a processing target object into a first separation body and a second separation body includes a first holder configured to hold the first separation body; a second holder configured to hold the second separation body; a moving unit configured to move the first holder and the second holder relatively to each other; and a separation surface cleaning unit configured to clean at least a separation surface of the first separation body or a separation surface of the second separation body.

BRIEF DESCRIPTION OF THE DRAWINGS

FIG. 19 is an explanatory diagram illustrating a positional relationship between a transfer pad of the transfer unit and a transfer arm of a wafer transfer device.

FIG. 20A to FIG. 20C are explanatory diagrams illustrating main processes of a first separation wafer carry-out processing.

DETAILED DESCRIPTION

Figure 1:
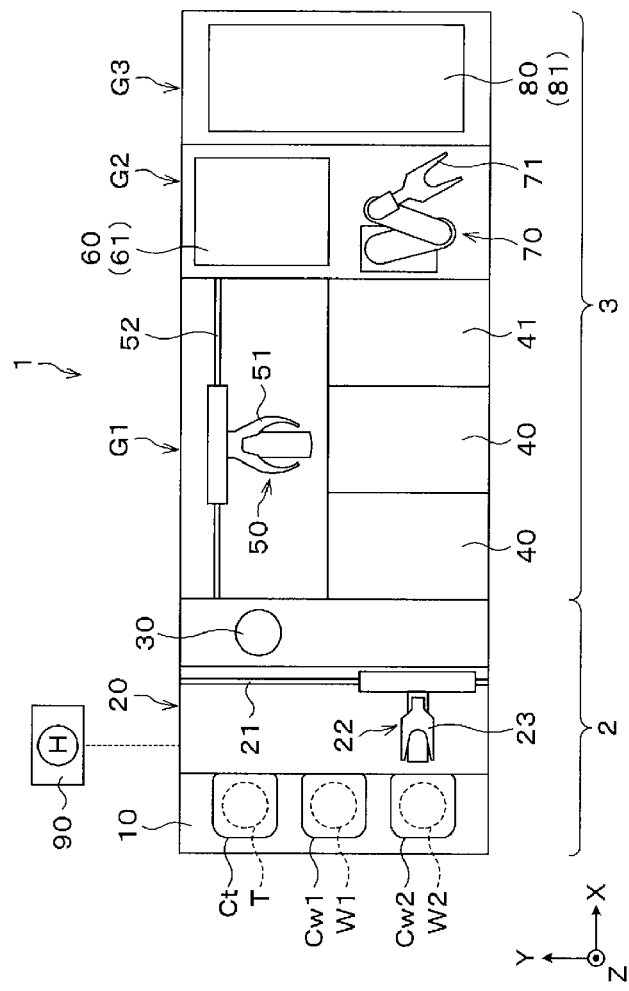
FIG. 1 is a plan view schematically illustrating a configuration of a wafer processing system according to an exemplary embodiment.

In a manufacturing process for a semiconductor device, a semiconductor wafer (hereinafter, simply referred to as a wafer) having a plurality of devices formed on a front surface thereof is thinned. There are various ways to thin the wafer. For example, there is a method of grinding a rear surface of the wafer or a method in which a laser beam (laser light) is radiated to an inside of the wafer to form a modification surface (modification layer) and the wafer is separated starting from this modification layer, as disclosed in Patent Document 1.

Here, when the wafer is separated starting from the modification layer as stated above, dust or debris may adhere to a separation surface of the wafer. If the wafer is transferred to a processing apparatus for a subsequent process with the dust or debris still attached thereto, there is a likelihood that contamination of an inside of an apparatus on a transfer path, contamination of a transfer mechanism that transfers the wafer, contamination of an inside of the processing apparatus in the subsequent process, etc., may occur. However, Patent Document 1 does not disclose or suggest anything about how to process the wafer after being separated. In this regard, there is a room for improvement in the conventional wafer separation processing.

Exemplary embodiments provide a technique enabling to appropriately separate a processing target object. Hereinafter, a wafer processing system equipped with a separating apparatus according to an exemplary embodiment and a wafer processing method will be described with reference to the accompanying drawings. In the present specification and the drawings, parts having substantially the same functional configurations will be assigned same reference numerals, and redundant description thereof will be omitted.

Figure 2:
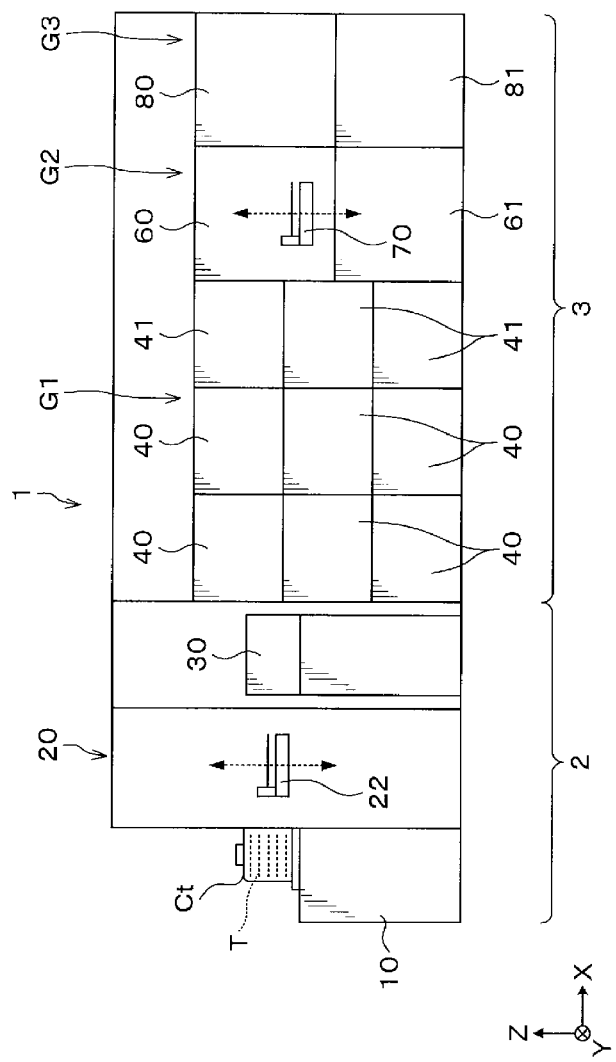
FIG. 2 is a side view schematically illustrating the configuration of the wafer processing system according to the exemplary embodiment.

First, a configuration of a wafer processing system according to an exemplary embodiment will be described. FIG. 1 is a plan view schematically illustrating a configuration of a wafer processing system 1. FIG. 2 is a side view schematically illustrating the configuration of the wafer processing system 1.

Figure 3:
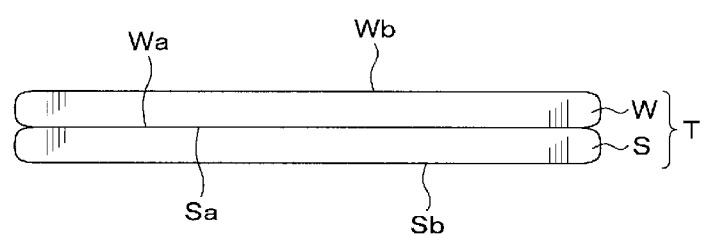
FIG. 3 is a side view schematically illustrating a structure of a combined wafer.
Figure 4:
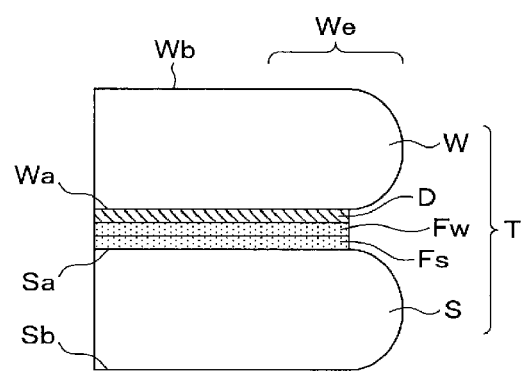
FIG. 4 is a side view schematically illustrating a structure of a part of the combined wafer.

The wafer processing system 1 performs a processing on a combined wafer T in which a processing target wafer W as a processing target object and a support wafer S are bonded to each other as shown in FIG. 3 and FIG. 4. The wafer processing system 1 thins the processing target wafer W while removing a peripheral portion We of the processing target wafer W. Hereinafter, in the processing target wafer W, a surface bonded to the support wafer S will be referred to as a front surface Wa, and a surface opposite to the front surface Wa will be referred to as a rear surface Wb. Likewise, in the support wafer S, a surface bonded to the processing target wafer W will be referred to as a front surface Sa, and a surface opposite to the front surface Sa will be referred to as a rear surface Sb.

The processing target wafer W is, for example, a semiconductor wafer such as a silicon substrate, and has, on the front surface Wa thereof, a device layer D including a plurality of devices. An oxide film Fw, for example, a $SiO_2$ film (TEOS film) is further formed on the device layer D. The peripheral portion We of the processing target wafer W is chamfered, and a thickness of the peripheral portion We decreases toward a leading end thereof on a cross section thereof. The peripheral portion We is a portion to be removed by edge trimming, and it ranges from, e.g., 1 mm to 5 mm from an edge of the processing target wafer W in a diametrical direction thereof. The edge trimming is a processing for suppressing the peripheral portion We of the processing target wafer W from having a sharply pointed shape (so-called knife edge shape) after the processing target wafer W is separated as will be described later.

In addition, in the wafer processing system 1 according to the exemplary embodiment, the processing target wafer W of the combined wafer T is separated. In the following description, the separated processing target wafer W on the front surface Wa side will be referred to as a first separation wafer W1 as a first separation body, and the separated processing target wafer W on the rear surface Wb side will be referred to as a second separation wafer W2 as a second separation body. The first separation wafer W1 has the device layer D and becomes a product. The second separation wafer W2 is reused. In the following description, the first separation wafer W1 may refer to the processing target wafer W supported by the support wafer S, and the first separation wafer W1 may sometimes be understood to include the support wafer S as well as the processing target wafer W. In addition, a separated surface of the first separation wafer W1 will be referred to as a separation surface W1a, and a separated surface of the second separation wafer W2 will be referred to as a separation surface W2a.

The support wafer S is a wafer that supports the processing target wafer W, and it is, for example, a silicon wafer. An oxide film Fs, for example, a $SiO_2$ film (TEOS film) is formed on the front surface Sa of the support wafer S. Further, in case that a plurality of devices is formed on the front surface Sa of the support wafer S, a device layer (not shown) is formed on the front surface Sa, the same as in the processing target wafer W.

Further, in FIG. 3, illustration of the device layer D and the oxide films Fw and Fs is omitted in order to avoid complexity of illustration. In addition, in other drawings to be referred to in the following description, illustration of the device layer D and the oxide films Fw and Fs may also be sometimes omitted.

As illustrated in FIG. 1, the wafer processing system 1 has a configuration in which a carry-in/out station 2 and a processing station 3 are connected as one body. The carry-in/out station 2 and the processing station 3 are arranged side by side toward the positive X-axis side from the negative X-axis side. In the carry-in/out station 2, cassettes Ct, Cw1 and Cw2 respectively capable of accommodating therein a multiple number of combined wafers T, a multiple number of first separation wafers W1, and a multiple number of second separation wafers W2 are carried to/from the outside, for example. The processing station 3 is equipped with various kinds of processing apparatuses configured to perform required processings on the combined wafers T and the separation wafers W1 and W2.

Further, although the cassette Ct and the cassette Cw1 are provided separately in the present exemplary embodiment, one and the same cassette may be used therefor. That is, a cassette for accommodating the combined wafer T before being processed and a cassette for accommodating the first separation wafer W1 after being processed may be the same one.

The carry-in/out station 2 is equipped with a cassette placing table 10. In the shown example, a plurality of, for example, three cassettes Ct, Cw1 and Cw2 can be arranged on the cassette placing table 10 in a row along the Y-axis direction. Here, the number of the cassettes Ct, Cw1 and Cw2 placed on the cassette placing table 10 is not limited to the example of the present exemplary embodiment, and may be selected as required.

In the carry-in/out station 2, a wafer transfer area 20 is provided adjacent to the cassette placing table 10 on the positive X-axis side of the cassette placing table 10. A wafer transfer device 22 capable of moving on a transfer path 21 elongated in the Y-axis direction is provided in the wafer transfer area 20. The wafer transfer device 22 has two transfer arms 23 configured to hold and transfer the combine wafer T and the separation wafers W1 and W2. Each transfer arm 23 is configured to be movable in a horizontal direction and a vertical direction and pivotable around a horizontal axis and a vertical axis. Further, the configuration of the transfer arm 23 is not limited to the example of the present embodiment, and various other configurations may be adopted. In addition, the wafer transfer device 22 is configured to be capable of transferring the combined wafer T and the separation wafers W1 and W2 to/from the cassettes Ct, Cw1 and Cw2 of the cassette placing table 10 and to/from a transition device 30 to be described later.

In the carry-in/out station 2, the transition device 30 configured to deliver the combined wafer T and the separation wafers W1 and W2 is provided adjacent to the wafer transfer area 20 on the positive X-axis side of the wafer transfer area 20.

The processing station 3 is provided with, for example, three processing blocks G1 to G3. The first processing block G1, the second processing block G2, and the third processing block G3 are arranged side by side in this order from the negative X-axis side (carry-in/out station 2 side) to the positive X-axis side.

The first processing block G1 is equipped with etching apparatuses 40, cleaning apparatuses 41, and a wafer transfer device 50. The etching apparatuses 40 are arranged in two rows in the X-axis direction and in three levels in the vertical direction on the carry-in/out station 2 side of the first processing block G1. That is, in the present exemplary embodiment, the six etching apparatuses 40 are provided. The cleaning apparatuses 41 are stacked in three levels in the vertical direction on the positive X-axis side of the etching apparatuses 40. The wafer transfer device 50 is disposed on the positive Y-axis side of the etching apparatuses 40 and the cleaning apparatuses 41. Here, the number and the layout of the etching apparatuses 40, the cleaning apparatuses 41, and the wafer transfer device 50 are not limited to the shown example.

The etching apparatus 40 is configured to etch the separation surface W1$a$ of the first separation wafer W1 or the separation surface W2$a$ of the second separation wafer W2. For example, an etching liquid (chemical liquid) is supplied to the separation surface W1$a$ or the separation surface W2$a$, and the separation surface W1$a$ or the separation surface W2$a$ is wet-etched. By way of non-limiting example, HF, $HNO_3$, $H_3PO_4$, TMAH, Choline, KOH, or the like may be used as the etching liquid.

The cleaning apparatus 41 is configured to clean the separation surface W1$a$ of the first separation wafer W1 or the separation surface W2$a$ of the second separation wafer W2. For example, a brush is brought into contact with the separation surface W1$a$ or the separation surface W2$a$, and the separation surface W1$a$ or the separation surface W2$a$ is scrub-cleaned. In addition, a pressurized cleaning liquid may be used for the cleaning of the separation surface W1$a$ or the separation surface W2$a$. Furthermore, when cleaning the separation surface W1$a$ or the separation surface W2$a$, the rear surface Sb or the rear surface Wb on the opposite side may also be cleaned.

The wafer transfer device 50 has two transfer arms 51 configured to hold and transfer the combined wafer T and the separation wafers W1 and W2. Each transfer arm 51 is configured to be movable in a horizontal direction and a vertical direction and pivotable around a horizontal axis and a vertical axis. Further, the configuration of the transfer arm 51 is not limited to the example of the present embodiment, and various other configurations may be adopted. The wafer transfer device 50 is movable on a transfer path 52 which is elongated in the X-axis direction. In addition, the wafer transfer device 50 is configured to be capable of transferring the combined wafer T and the separation wafers W1 and W2 to/from the transition device 30 and the respective processing apparatuses of the first and second processing blocks G1 and G2.

The second processing block G2 is equipped with an alignment apparatus 60, a separating apparatus 61, and a wafer transfer device 70. The alignment apparatus 60 and the separating apparatus 61 are stacked vertically from above to below. The wafer transfer device 70 is disposed on the negative Y-axis side of the alignment apparatus 60 and the separating apparatus 61. Here, the number and the layout of the alignment apparatus 60, the separating apparatus 61, and the wafer transfer device 70 are not limited to the shown example.

The alignment apparatus 60 is configured to adjust a direction of the processing target wafer W before being laser-processed in a horizontal direction and a center position thereof. By way of example, a position of a notch of the processing target wafer W is detected by a detector (not shown) while the processing target wafer W held by a spin chuck (not shown) is being rotated. By adjusting the position of the notch, the direction of the processing target wafer W in the horizontal direction and the center position thereof are adjusted.

The separating apparatus 61 is configured to separate the processing target wafer W into the first separation wafer W1 and the second separation wafer W2 starting from a peripheral modification layer and an internal modification layer formed in an internal modifying apparatus 81 to be described later. A specific configuration of the separating apparatus 61 will be described later.

The wafer transfer device 70 has two transfer arms 71 and 71 configured to hold and transfer the combined wafer T and the separation wafers W1 and W2. Each transfer arm 71 is configured to be movable in a horizontal direction and a vertical direction and pivotable around a horizontal axis and a vertical axis. Further, the configuration of the transfer arm 71 is not limited to the example of the present embodiment, and various other configurations may be adopted. In addition, the number of the transfer arms 71 in the wafer transfer device 70 is not limited to the example of the present exemplary embodiment, and any required number of transfer arms 71 may be provided. For example, only one transfer arm 71 may be provided. The transfer arm 71 is configured to be capable of transferring the combined wafer T and the separation wafers W1 and W2 to/from the respective processing apparatuses of the first to third processing blocks G1 to G3.

The third processing block G3 is equipped with a surface modifying apparatus 80 and the internal modifying apparatus 81. The surface modifying apparatus 80 and the internal modifying apparatus 81 are stacked vertically from above to below. Here, the number and the layout of the surface modifying apparatus 80 and the internal modifying apparatus 81 are not limited to the shown example.

The surface modifying apparatus 80 is configured to radiate laser light to an outer peripheral portion of the device layer D of the processing target wafer W to modify the outer peripheral portion. As the laser light, laser light ($CO_2$ laser) having a wavelength featuring transmissivity for the processing target wafer W is used.

The internal modifying apparatus 81 is configured to radiate laser light to an inside of the processing target wafer W to form a peripheral modification layer and an internal modification layer. As the laser light, laser light (YAG laser) having a wavelength featuring transmissivity for the processing target wafer W is used. The peripheral modification layer and the internal modification layer serve as starting points when the processing target wafer W is separated into surface W1$a$ of the first separation wafer W1 and the second separation wafer W2.

The wafer processing system 1 described above is equipped with a control device 90. The control device 90 is, for example, a computer having a CPU and a memory, and includes a program storage (not shown). The program storage stores therein a program for controlling processings of the combined wafer T and the separation wafers W1 and W2 in the wafer processing system 1. In addition, the program storage also stores therein a program for controlling operations of the above-described various processing apparatuses and a driving system such as the transfer devices to implement a wafer processing to be described later in the wafer processing system 1. In addition, the program may be recorded in a computer-readable storage medium H and installed from this recording medium H to the control device 90.

Figure 5:
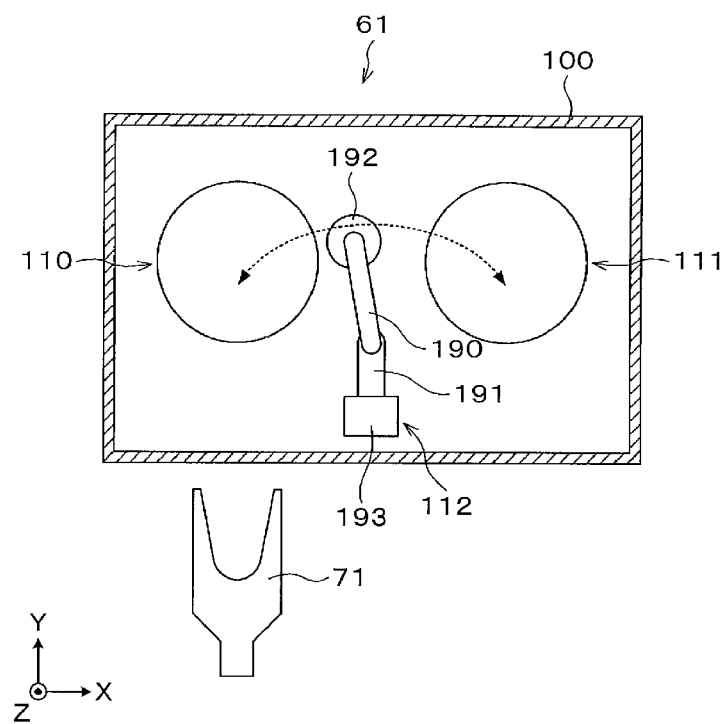
FIG. 5 is a plan view illustrating a schematic configuration of a separating apparatus.

Now, the aforementioned separating apparatus 61 will be described. FIG. 5 is a plan view illustrating a schematic configuration of the separating apparatus 61.

The separating apparatus 61 includes a processing vessel 100 having a sealable inside. A carry-in/out opening (not shown) for the combined wafer T and the separation wafers W1 and W2 is formed at a side surface of the processing vessel 100, and an opening/closing shutter (not shown) is provided at this carry-in/out opening.

A separation processing unit 110, a pad cleaning unit 111, and a transfer unit 112 are provided within the separating apparatus 61. In the separation processing unit 110, the processing target wafer W is separated into the first separation wafer W1 and the second separation wafer W2. In the pad cleaning unit 111, a transfer pad 192 of the transfer unit 112, which will be described later, is cleaned. The transfer unit 112 transfers the second separation wafer W2 between the separation processing unit 110 and the wafer transfer device 70.

Figure 6:
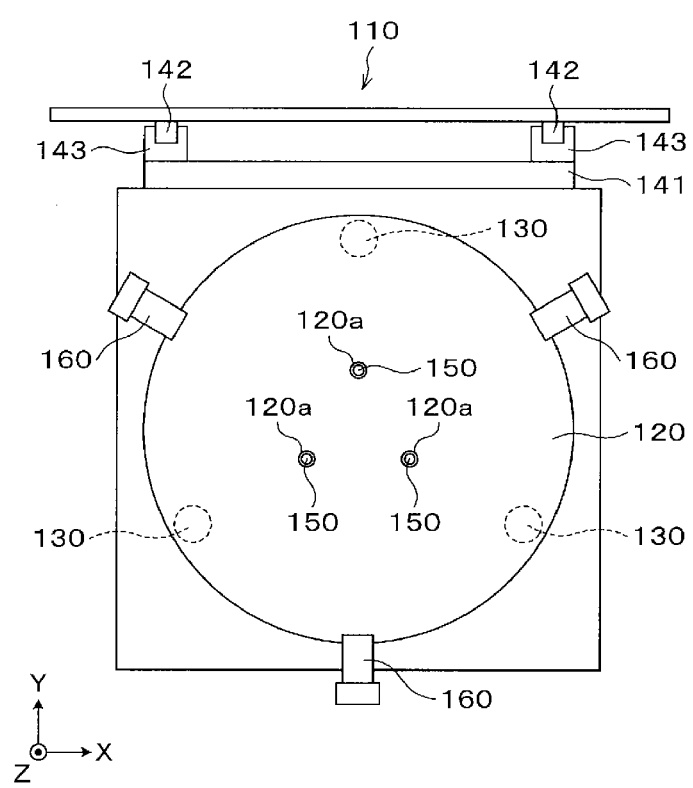
FIG. 6 is a plan view schematically illustrating a schematic configuration of a separation processing unit.
Figure 7:
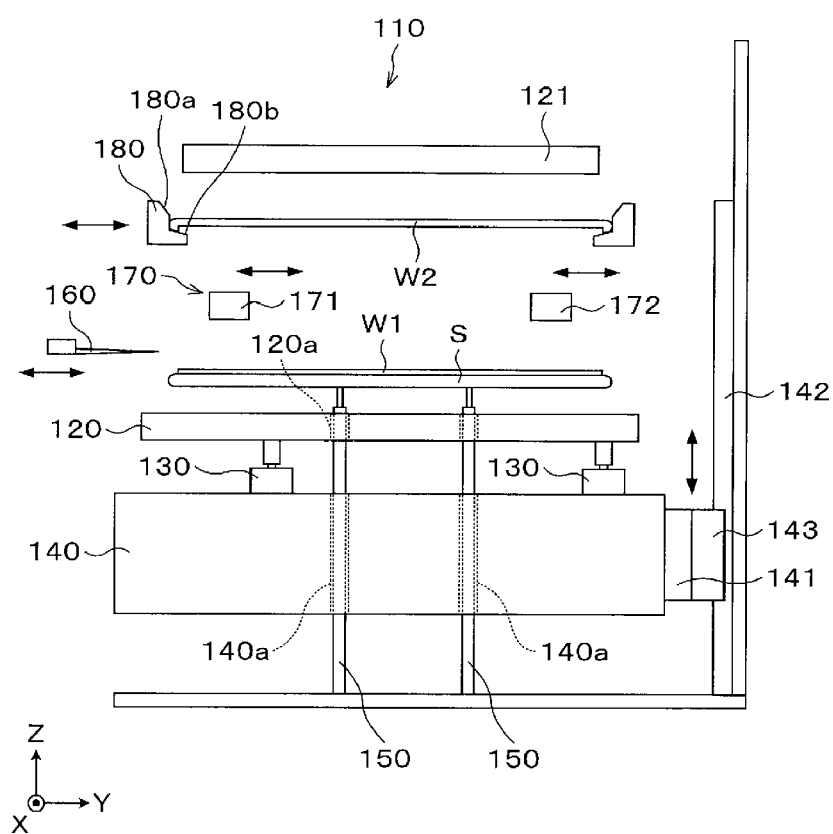
FIG. 7 is a side view illustrating the schematic configuration of the separation processing unit.
Figure 8:
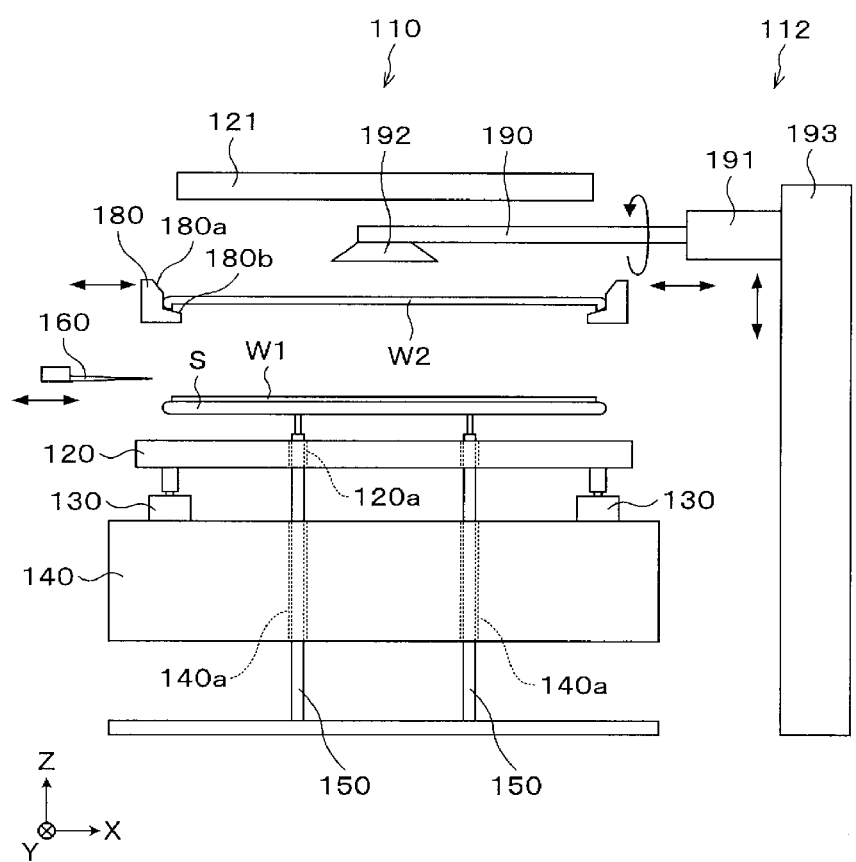
FIG. 8 is a side view schematically illustrating a configuration of the separation processing unit and a transfer unit.

FIG. 6 is a plan view illustrating a schematic configuration of the separation processing unit 110. FIG. 7 is a side view illustrating a schematic configuration of the separation processing unit 110. FIG. 8 is a side view illustrating a schematic configuration of the separation processing unit 110 and the transfer unit 112.

The separation processing unit 110 includes a first holder 120, a second holder 121, load cells 130, a stage 140, supporting pins 150, blades 160, a separation surface cleaning unit 170, and a delivery unit 180.

The first holder 120 is provided under the second holder 121. The first holder 120 and the second holder 121 hold the combined wafer T before being subjected to the separation of the processing target wafer W, allowing the processing target wafer W to face upwards. That is, the first holder 120 attracts and holds the first separation wafer W1 (support wafer S), and the second holder 121 attracts and holds the second separation wafer W2.

The first holder 120 is a chuck having a substantially disk shape and communicates with, for example, a suction apparatus (not shown) such as, but not limited to, a vacuum pump. The first holder 120 has a diameter larger than that of the first separation wafer W1, and attracts and holds the first separation wafer W1 on the entire top surface thereof.

The second holder 121 is a chuck having a substantially disk shape and communicates with a suction apparatus (not shown) such as, but not limited to, a vacuum pump. The second holder 121 has a diameter smaller than that of the second separation wafer W2, specifically, smaller than that of the peripheral modification layer formed in the processing target wafer, as will be described later. The second holder 121 attracts and holds, on a bottom surface thereof, a portion of the second separation wafer W2 inner than the peripheral modification layer.

A bottom surface of the first holder 120 is supported by the stage 140 with the load cells 130 as a load measurer therebetween. A plurality of, for example, three load cells 130 each of which is configured to detect a force (load) acting on the first holder 120 are equi-spaced on an outer periphery of the first holder 120 on a circle concentric with the first holder 120. The number and the layout of the load cells 130 are not limited to the shown example. By way of example, the load cells 130 may be provided at a center portion of the first holder 120.

Further, although the load cells 130 measure a load when separating the processing target wafer W as will be described later, they may be used when setting up the separating apparatus 61. By way of example, in a state where the first holder 120 and the second holder 121 do not hold the combined wafer T (processing target wafer W, support wafer S), the first holder 120 and the second holder 121 are brought into contact, and the position where the load is measured by the load cell 130 is used as a reference position (zero point position).

The stage 140 is supported by a supporting member 141. The stage 140 (first holder 120) is configured to be movable up and down by an elevating mechanism 143 along a rail 142 elongated in a vertical direction. The elevating mechanism 143 includes, for example, a motor (not shown), a ball screw (not shown), and a guide (not shown). Further, in the present exemplary embodiment, the rail 142 and the elevating mechanism 143 correspond to a moving unit of the present disclosure.

The supporting pins 150 elongated in the vertical direction are provided on a bottom surface of the separation processing unit 110. The number of the supporting pins 150 may be, for example, three, and these three supporting pins 150 are inserted through through holes 120a of the first holder 120 and through holes 140a of the stage 140. In the state where the stage 140 is raised, leading ends of the supporting pins 150 are protruded above a top surface of the first holder 120, and the first separation wafer W1 (support wafer S) are supported by these supporting pins 150. Further, in the state that the stage 140 is lowered, the leading ends of the supporting pins 150 are positioned below the top surface of the first holder 120.

In addition, although the first separation wafer W1 is transferred onto the supporting pins 150 as the stage 140 is moved up and down in the present exemplary embodiment, the supporting pins 150 may be moved up and down. Furthermore, a pad (not shown) configured to attract and hold the first separation wafer W1 may be used instead of the supporting pins 150.

Blades 160 to be inserted into the combined wafer T (specifically, an interface between the processing target wafer W and the support wafer S as will be described later) as insertion members are provided between the first holder 120 and the second holder 121. At a lateral side of the second holder 21, a plurality of, for example, three blades 160 are equi-spaced on a circle concentric with the second holder 121. Each blade 160 is configured to be moved in the horizontal direction and the vertical direction by a moving mechanism (not shown) and be advanced to and retreated from an outer side surface of the combined wafer T held by the first holder 120 and the second holder 121. Here, the number and the layout of the blades 160 are not limited to the shown example. Further, the way how to move the blades 160 may be selected as required. In addition, in case that the first separation wafer W1 and the second separation wafer W2 can be separated without needing to insert the blades 160, for example, the blades 160 may be omitted.

The separation surface cleaning unit 170 configured to clean the separation surface W1a of the first separation wafer W1 and the separation surface W2a of the second separation wafer W2 is provided between the first holder 120 and the second holder 121. The separation surface cleaning unit 170 includes a cleaning nozzle 171 and a suction nozzle 172. The cleaning nozzle 171 supplies, for example, air as a cleaning fluid. The suction nozzle 172 sucks the air supplied from the cleaning nozzle 171. Each of the cleaning nozzle 171 and the suction nozzle 172 is configured to be moved in the horizontal direction and the vertical direction by a moving mechanism (not shown) and be advanced to and retreated from a space between the first holder 120 and the second holder 121.

In addition, in the present exemplary embodiment, although the air is used as the cleaning fluid, the exemplary embodiment is not limited thereto, a cleaning liquid such as pure water or a dual-fluid may be used. In addition, when cleaning the separation surfaces W1a and W2a by using the cleaning liquid, the cleaning liquid remaining after the cleaning may be scattered off to dry the separations surfaces W1a and W2a by rotating the first holder 120 and the second holder 121.

The delivery unit 180 configured to deliver the second separation wafer W2 from the second holder 121 to the transfer unit 112 is provided between the first holder 120 and the second holder 121. Formed at an upper end of the delivery unit 180 is a tapered portion 180a whose diameter decreases from an upper end to a lower end thereof to form a taper shape, when viewed from the side. Further, an end portion 180b protruding inwards in a diametrical direction is formed at a lower end of the delivery unit 180. An inner diameter of the upper end of the tapered portion 180a is larger than a diameter of the second separation wafer W2, and an inner diameter of the lower end of the tapered portion 180a is substantially the same as the diameter of the second separation wafer W2. Further, an inner diameter of the end portion 180b is smaller than the diameter of the second separation wafer W2. The second separation wafer W2 is separated from the second holder 121, guided to the tapered portion 180a, and placed at the end portion 180b. In this way, the second separation wafer W2 is held by the delivery unit 180 with its center position adjusted by the delivery unit 180 (centering). Furthermore, the delivery unit 180 is moved in the horizontal direction and the vertical direction by a moving mechanism (not shown) and is configured to be advanced to and retreated from the space between the first holder 120 and the second holder 121.

The transfer unit 112 is a multi-joint robot having a plurality of, for example, two arms 190 and 191. Of the two arms 190 and 191, the first arm 190 at a leading end is equipped with the transfer pad 192 configured to attract and hold a central portion of the second separation wafer W2. Further, the second arm 191 at a base end is mounted to a moving mechanism 193. The arms 190 and 191 and the transfer pad 192 are configured to be movable in the horizontal direction and the vertical direction by a moving mechanism 193, and the transfer pad 192 is also configured to be rotatable around an axis of the arms 190 and 191. In addition, although the one transfer pad 192 is provided for the first arm 190 in the present exemplary embodiment, two transfer pads 192 may be provided on both surfaces of the first arm 190. Further, in the present exemplary embodiment, the delivery unit 180 and the transfer unit 112 correspond to a rotation unit of the present disclosure. Moreover, although the transfer unit 112 is the multi-joint robot in the present exemplary embodiment, the present exemplary embodiment is not limited thereto, and various other configurations may be adopted.

The pad cleaning unit 111 is configured to clean the transfer pad 192 of the transfer unit 112. The pad cleaning unit 111 includes a cleaning tool such as, but not limited to, a stone cleaning tool (not shown) or a brush cleaning tool (not shown). The transfer pad 192 is cleaned by bringing the cleaning tool into contact with an attraction surface of the transfer pad 192. Here, however, the way how to clean the transfer pad 192 in the pad cleaning unit 111 is not limited thereto. By way of example, the transfer pad 192 may be cleaned by supplying air, a cleaning liquid, a dual-fluid, or the like to the attraction surface of the transfer pad 192.

Figure 9:
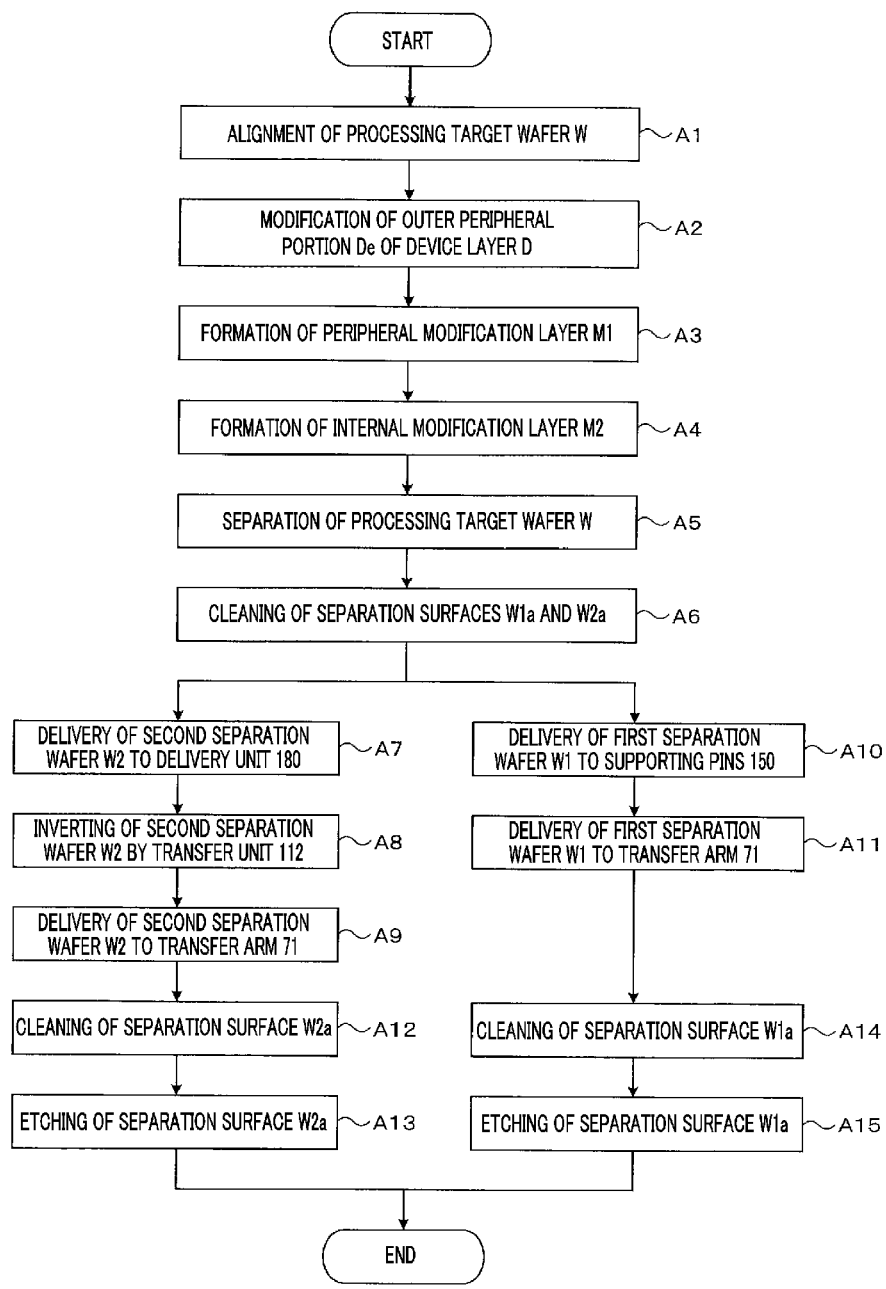
FIG. 9 is a flowchart illustrating main processes of a wafer processing.

Now, a wafer processing performed by using the wafer processing system 1 configured as described above will be explained. FIG. 9 is a flowchart illustrating main processes of the wafer processing. FIG. 10A to FIG. 10H is an explanatory diagram illustrating the main processes of the wafer processing. Further, in the present exemplary embodiment, the processing target wafer W and the support wafer S are bonded in a bonding apparatus (not shown) at an outside of the wafer processing system 1 to form the combined wafer T in advance.

Figure 10:
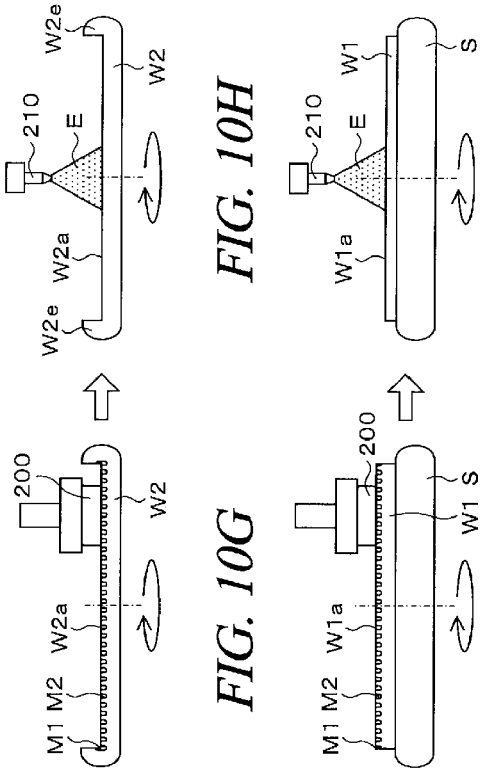
FIG. 10A to FIG. 10H are explanatory diagrams illustrating the main processes of the wafer processing.

First, the cassette Ct accommodating therein the multiple number of combined wafers T shown in FIG. 10A is placed on the cassette placing table 10 of the carry-in/out station 2.

Then, the combined wafer T in the cassette Ct is taken out by the wafer transfer device 22 and transferred to the transition device 30. Next, the combined wafer T of the transition device 30 is taken out by the wafer transfer device 50 and transferred to the alignment apparatus 60. In the alignment apparatus 60, the direction of the processing target wafer W of the combined wafer T in the horizontal direction and the center position thereof are adjusted (process A1 in FIG. 9).

Figure 11:
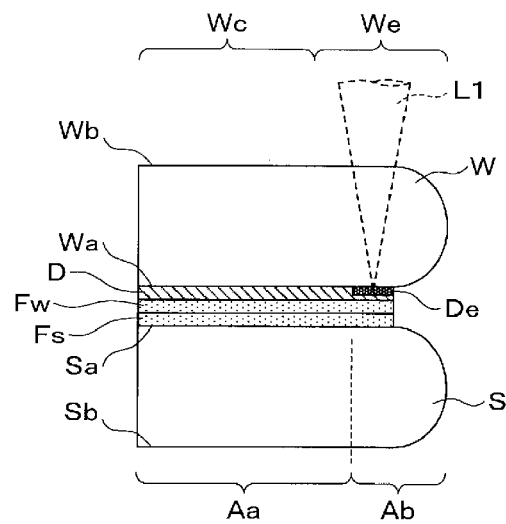
FIG. 11 is an explanatory diagram illustrating a state in which an outer peripheral portion of a device layer of a processing target wafer is being modified.

Then, the combined wafer T is transferred to the surface modifying apparatus 80 by the wafer transfer device 70. In the surface modifying apparatus 80, laser light L1 is radiated to the outer peripheral portion De of the device layer D from a laser head (not shown) to modify the outer peripheral portion De, as shown in FIG. 11 (process A2 in FIG. 9). More specifically, an interface between the processing target wafer W and the device layer D is modified. Further, although the interface between the processing target wafer W and the device layer D at the outer peripheral portion De is modified in the present exemplary embodiment, the entire outer peripheral portion De of the device layer D may be modified, or even the oxide film Fw may be modified.

If the outer peripheral portion De is modified in the process A2, bonding strength is reduced, and a bonding region Aa where the oxide film Fw and the oxide film Fs are bonded and a non-bonding region Ab, which is a region outside the bonding region Aa in the diametrical direction, are formed at the interface between the processing target wafer W and the device layer D. In a separating process for the processing target wafer W to be described later, the peripheral portion We is removed from the first separation wafer W1 by edge trimming. When performing this edge trimming, the peripheral portion We can be removed appropriately owing to the presence of the non-bonding region Ab. Further, an outer end of the bonding region Aa is located at a slightly outer side than an inner end of the peripheral portion We to be removed in the diametrical direction.

Subsequently, the combined wafer T is transferred to the internal modifying apparatus 81 by the wafer transfer device 70. In the internal modifying apparatus 81, a peripheral modification layer M1 is formed within the processing target wafer W, as shown in FIG. 1013 (process A3 in FIG. 9), and an internal modification layer M2 is also formed as shown in FIG. 10C (process A4 in FIG. 9). The peripheral modification layer M1 serves as a starting point for removing the peripheral portion We in the edge trimming. The internal modification layer M2 serves as a starting point for separating and thinning the processing target wafer W.

Figure 12:
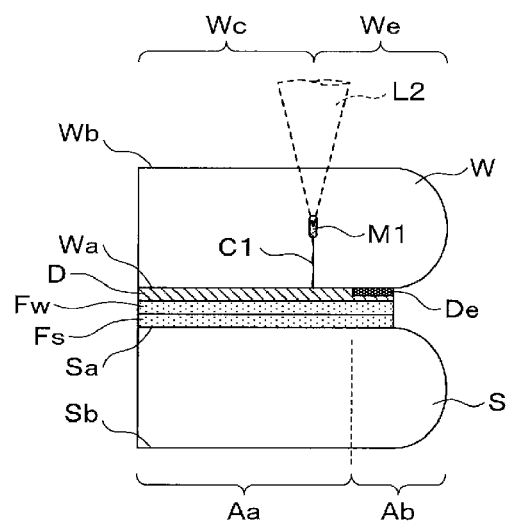
FIG. 12 is an explanatory diagram illustrating a state in which a peripheral modification layer is being formed in the processing target wafer.
Figure 13:
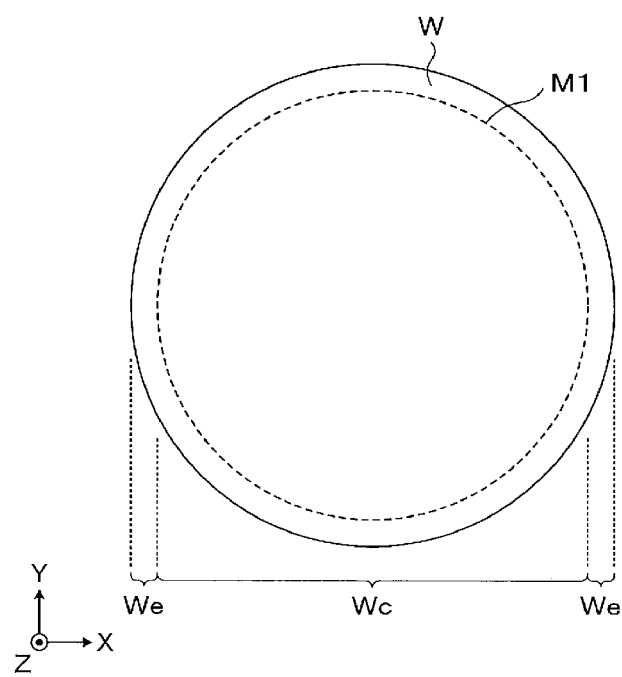
FIG. 13 is an explanatory diagram illustrating a state in which the peripheral modification layer is formed in the processing target wafer.

In the internal modifying apparatus 81, by radiating laser light L2 (laser light L2 for periphery) is radiated from a laser head (not shown), the peripheral modification layer M1 is first formed at a boundary between the peripheral portion We and a central portion Wc of the processing target wafer W, as shown in FIG. 12 and FIG. 13 (process A3 in FIG. 9). As a specific example, by radiating the laser light L2 while rotating the processing target wafer W, the peripheral modification layer M1 having an annular shape is formed. Further, within the processing target wafer W, a crack C1 starting from the peripheral modification layer M1 only advances to the front surface Wa and does not reach the rear surface Wb.

Figure 14:
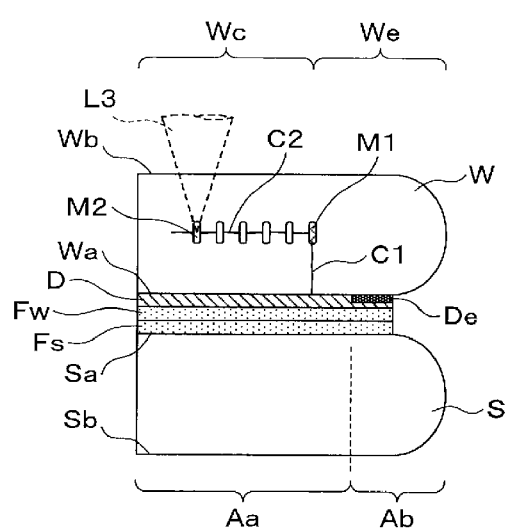
FIG. 14 is an explanatory diagram illustrating a state in which an internal modification layer is being formed in the processing target wafer.
Figure 15:
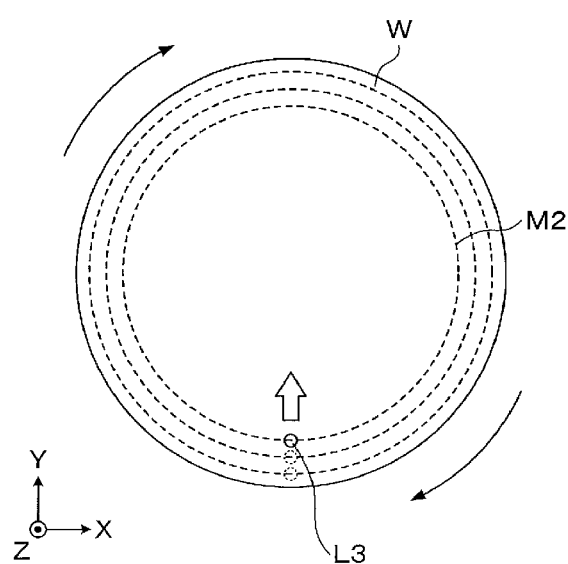
FIG. 15 is an explanatory diagram illustrating a state in which the internal modification layer is being formed in the processing target wafer.

Subsequently, by radiating laser light L3 (laser light L3 for internal surface) from a laser head (not shown), the internal modification layer M2 is formed along a plane direction, as depicted in FIG. 14 and FIG. 15 (process A4 in FIG. 9). As a specific example, by radiating the laser light L3 while rotating the processing target wafer W one round (360 degrees), the internal modification layer M2 having an annular shape is formed. Then, the laser head is moved inwards in the diametrical direction of the processing target wafer W. By repeating the formation of the annular internal modification layer M2 and the inward movement of the laser head in the diametrical direction, the internal modification layer M2 is formed in the plane direction. Further, within the processing target wafer W, a crack C2 develops from the internal modification layer M2 in the plane direction. This crack C2 develops only inside the peripheral modification layer M1.

Further, in the present exemplary embodiment, after the outer peripheral portion De of the device layer D is modified in the process A2, the peripheral modification layer M1 and the internal modification layer M2 are formed in the processes A3 and A4. However, this order may be reversed. That is, after the peripheral modification layer M1 and the internal modification layer M2 are formed, the outer peripheral portion De may be modified.

Next, the combined wafer T is transferred to the separating apparatus 61 by the wafer transfer device 70. In the separating apparatus 61, the processing target wafer W is separated into the first separation wafer W1 and the second separation wafer W2, starting from the peripheral modification layer M1 and the internal modification layer M2, as shown in FIG. 10D (process A5 in FIG. 9). At this time, the peripheral portion We is also removed from the first separation wafer W1.

Figure 16A:
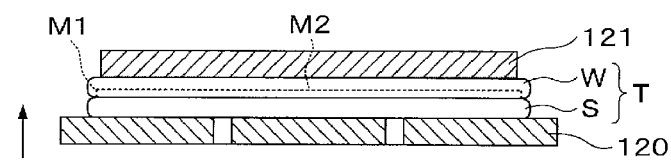
FIG. 16A to FIG. 16D are explanatory diagrams illustrating main processes of a separation processing.

First, in the separating apparatus 61, the combined wafer T is transferred from the transfer arm 71 of the wafer transfer device 70 onto the supporting pins 150. Then, the stage 140 is moved up to raise the first holder 120, and the combined wafer T is transferred from the supporting pins 150 onto the first holder 120 to be attracted to and held by the first holder 120. Further, the first holder 120 is raised, and the support wafer S (the first separation wafer W1_side) is attracted to and held by the first holder 120 and the processing target wafer W (the second separation wafer W2 side) is attracted to and held by the second holder 121, as shown in FIG. 16A.

Figure 17:
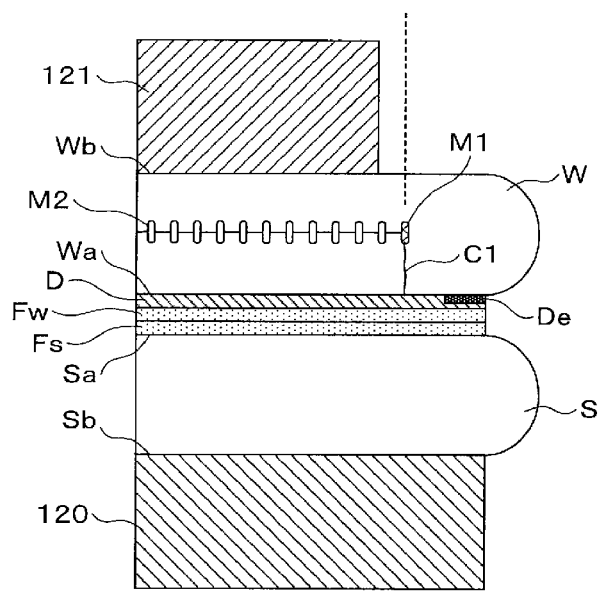
FIG. 17 is an explanatory diagram illustrating a state in which a second holder is holding the processing target wafer.

At this time, as shown in FIG. 17, the second holder 121 attracts and holds a portion of the processing target wafer W at an inner side than the peripheral modification layer M1 formed in the processing target wafer W. In the present exemplary embodiment, an outer end of the second holder 121 is located at an inner side than the peripheral modification layer M1. That is, a diameter of the second holder 121 is smaller than a diameter of the peripheral modification layer M1. Here, the peripheral portion We of the processing target wafer W to which the laser lights L2 and L3 are radiated may be bent. In this case, it becomes difficult for the second holder 121 to attract and hold the processing target wafer W on the entire surface thereof. Furthermore, there is a risk that the processing target wafer W may be damaged by a load applied when the processing target wafer W is attracted to the second holder 121. In the present exemplary embodiment in particular, since a step-shaped portion is formed at the second separation wafer W2 by the peripheral modification layer M1 and the internal modification layer M2, there is a risk that the step-shaped portion may be damaged. To solve the problem, by attracting and holding the inner side (inner than the peripheral portion We) of the peripheral modification layer M1 where the bending of the second holder 121 tends to occur as in the present exemplary embodiment, the processing target wafer W may be properly held, and the damage on the processing target wafer W may be suppressed. Further, the outer end of the second holder 121, that is, the outer end of the second holder 121 with respect to the processing target wafer W held by the second holder 121 may be aligned with the peripheral modification layer M1.

Moreover, when attracting and holding the combined wafer T with the first holder 120 and the second holder 121, the combined wafer T is pressed, and a load is applied thereto. In the present exemplary embodiment, the load applied to the first holder 120 and the second holder 121 is measured and monitored by using the load cells 130. Accordingly, the load applied to the combined wafer T may be made to fall within a tolerance range, so that the combined wafer T may be suppressed from being damaged. Furthermore, since the plurality of load cells 130 are provided, a load distribution within the surface of wafer can be measured, and it can be checked whether the processing target wafer W is pressed uniformly within the surface thereof. In addition, since the reference position (zero point position) of the first holder 120 is determined at the time of setup as stated above, the height of the first holder 120 is controlled when it is raised. However, the height of the first holder 120 may be controlled by using the load measurement result of the load cells 130.

Additionally, a pressure sensor (not shown) provided at each of the first holder 120 and the second holder 121 measures and monitors a pressure. Accordingly, it can be checked whether the combined wafer T is properly attracted to and held by each of the first holder 120 and the second holder 121.

Figure 16B:
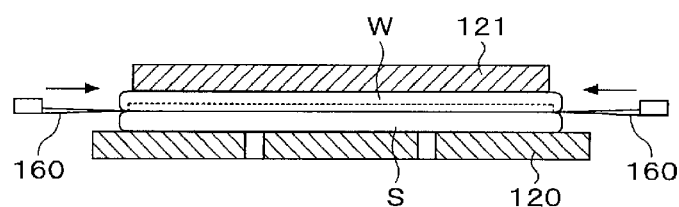

Next, as shown in FIG. 16B, the blades 160 are inserted into the interface between the processing target wafer W and the support wafer S to cut the first separation wafer W1 and the second separation wafer W2 along the peripheral modification layer M1 and the internal modification layer M2.

Figure 16C:
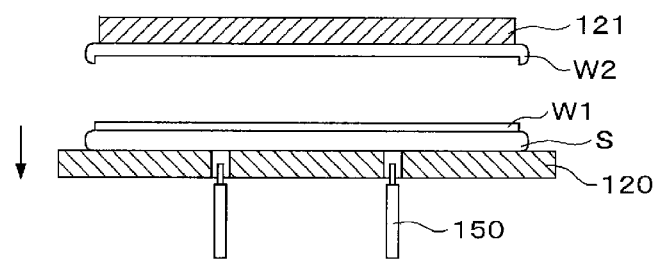

Then, as shown in FIG. 16C, by lowering the first holder 120, the first separation wafer W1 held by the first holder 120 and the second separation wafer W2 held by the second holder 121 are separated.

When separating the processing target wafer W as described above, the load applied to the first holder 120 and the second holder 121 is measured and monitored by using the load cells 130. Accordingly, the load applied to the processing target wafer W can be made to fall within the tolerance range, so that processing target wafer W can be suppressed from being damaged. Further, since the plurality of load cells 130 are provided, the load distribution within the surface of the wafer can be measured, so that it can be checked whether the processing target wafer W is uniformly separated in the surface thereof.

Further, the pressure is measured and monitored by the pressure sensors (not shown) provided at the first holder 120 and the second holder 121. Accordingly, presence or absence of the first separation wafer W1 and the second separation wafer W2 can be detected in the first holder 120 and the second holder 121, respectively, so that it becomes possible to determine whether the first separation wafer W1 and the second separation wafer W2 are separated.

Figure 16D:
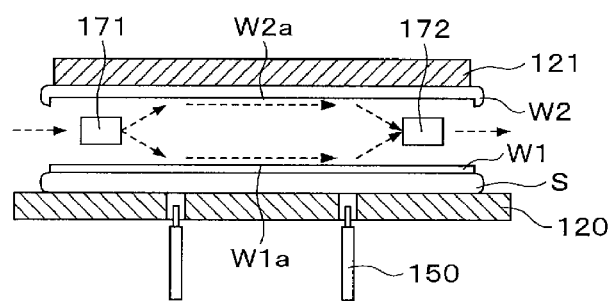

Afterwards, as shown to FIG. 16D, the cleaning nozzle 171 and the suction nozzle 172 are moved to be placed between the first holder 120 and the second holder 121. Then, the cleaning nozzle 171 supplies air, and the suction nozzle 172 sucks the air. Accordingly, a flow of the air heating toward the suction nozzle 172 from the cleaning nozzle 171 is formed between the first separation wafer W1 and the second separation wafer W2. Dust or debris (particles) adhering to the separation surfaces W1a and W2a are removed by this air, so that the separation surfaces W1a and W2a are cleaned (process A6 in FIG. 9).

Further, when cleaning the separation surfaces W1a and W2a in the process A6, it is desirable to make a space between the separation surfaces W1a and W2a as small as possible. In such a case, a flow velocity of the air flowing in this space can be increased, and the space can be filled with the air. Therefore, the separation surfaces W1a and W2a can be cleaned more efficiently.

Next, the first separation wafer W1 and second separation wafer W2 that are separated are carried out of the separating apparatus 61. Although the separation surfaces W1a and W2a are cleaned in the process A6 as described above, the transfer of the first separation wafer W1 and the second separation wafer W2 is performed without holding the separation surface W1a and the separation surface W2a in order to avoid contamination of the inside of the apparatus more reliably.

Figure 18A:
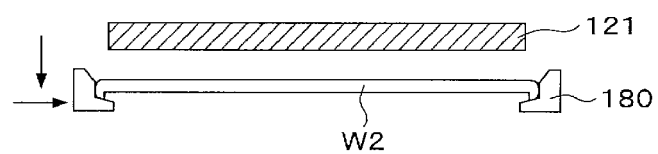
FIG. 18A to FIG. 18E are explanatory diagrams illustrating main processes of a second separation wafer carry-out processing.

FIG. 18A to FIG. 18E are explanatory diagrams illustrating a process of carrying out the second separation wafer W2 from the separating apparatus 61. First, as shown in FIG. 18A, the delivery unit 180 is moved to the space between the first holder 120 and the second holder 121 and placed under the second separation wafer W2. Subsequently, the attraction and holding of the second separation wafer W2 by the second holder 121 is stopped, and the second separation wafer W2 is transferred from the second holder 121 onto the delivery unit 180 (process A7 of FIG. 9).

Figure 18B:
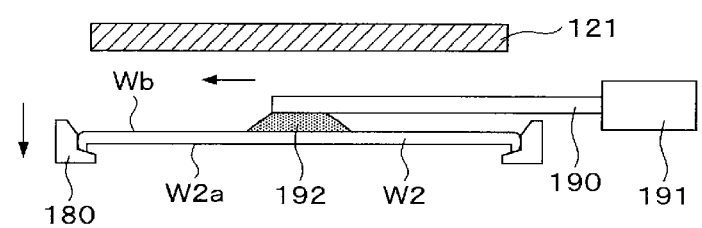
Figure 18C:
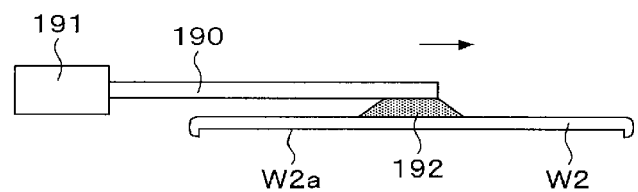
Figure 18D:
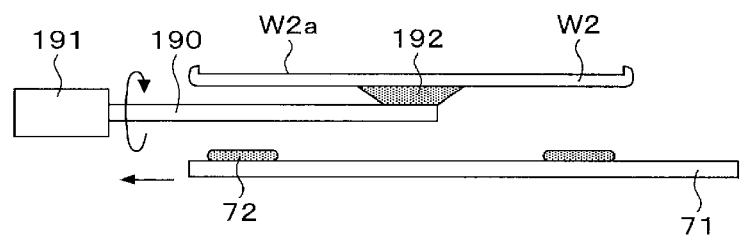

Next, as shown in FIG. 18B, the delivery unit 180 holding the second separation wafer W2 is lowered, and, then, the transfer pad 192 of the transfer unit 112 is moved to be placed between the second holder 121 and the delivery unit 180. Then, a center portion of the rear surface Wb of the second separation wafer W2 is attracted to and held by the transfer pad 192. Thereafter, as shown in FIG. 18C, the transfer pad 192 is retreated from below the second holder 121 and the front surface and the rear surface of the second separation wafer W2 are inverted by the transfer pad 192, as shown in FIG. 18D (process A8 in FIG. 9). That is, the separation surface W2a of the second separation wafer W2 is turned to face upwards.

Figure 18E:
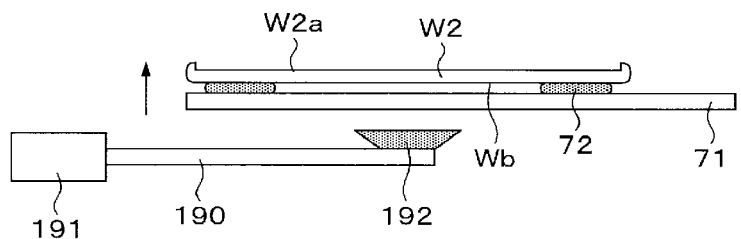

Thereafter, as shown in FIG. 18D, the transfer arm 71 of the wafer transfer device 70 is moved to be placed under the transfer pad 192. Then, as shown in FIG. 18E, the transfer arm 71 is raised, and the second separation wafer W2 is transferred from the transfer pad 192 onto the transfer arm 71 (process A9 in FIG. 9). At this time, the second separation wafer W2 may be handed over to the transfer arm 71 from the transfer pad 192 by lowering the transfer pad 192. In this way, the second separation wafer W2 is taken out from the separating apparatus 61 by the wafer transfer device 70.

Here, as shown in FIG. 19, the transfer arm 71 has a fork shape branched from a base end portion 71a into two leading end portions 72b. A suction pad 72 configured to attract and hold the second separation wafer W2 is provided at each of the base end portion 71a and the leading end portions 72b. In the present exemplary embodiment, the transfer pad 192 and the first arm 190 enter a gap between the two leading end portions 72b when viewed from the top. For this reason, when the second separation wafer W2 is transferred in the process A9, the transfer unit 112 and the transfer arm 71 do not interfere with each other.

Further, in the present exemplary embodiment, the second separation wafer W2 is directly transferred from the transfer pad 192 to the transfer arm 71 in the process A9. However, the second separation wafer W2 is temporarily placed in a standby section (not shown) from the transfer pad 192, and, then, the transfer arm 71 may receive the second separation wafer W2. However, when the second separation wafer W2 is directly transferred from the transfer pad 192 to the transfer arm 71, deviation of the second separation wafer W2 is suppressed.

FIG. 20A to FIG. 20C are explanatory view illustrating a process of carrying out the first separation wafer W1 from the separating apparatus 61. First, as shown in FIG. 20A, the first holder 120 is lowered and the first separation wafer W1 is transferred from the first holder 120 to the supporting pins 150 (process A10 in FIG. 9).

Next, as shown in FIG. 20B, the transfer arm 71 of the wafer transfer device 70 is moved to below the first separation wafer W1. Thereafter, as shown in FIG. 20C, by raising the transfer arm 71, the first separation wafer W1 is transferred from the supporting pins 150 onto the transfer arm 71 (process A11 in FIG. 9). In this way, the first separation wafer W1 is carried out from the separating apparatus 61 by the wafer transfer device 70.

Next, a subsequent processing is performed on the second separation wafer W2 and the first separation wafer W1 carried out from the separating apparatus 61 as described above.

That is, the second separation wafer W2 is transferred to the cleaning apparatus 41 by the wafer transfer device 70. In the cleaning apparatus 41, as shown in FIG. 10E, the separation surface W2a of the second separation wafer W2 is scrub-cleaned (process A12 in FIG. 9).

In the process A12, while carrying on the rotation of the second separation wafer W2 by a spin chuck (not shown), pure water, for example, is supplied from the scrub cleaning tool 200 such as a brush while bringing the scrub cleaning tool 200 into contact with the separation surface W2a from above. Accordingly, the separation surface W2a is cleaned and particles are removed from the separation surface W2a. Thereafter, after the scrub cleaning tool 200 is retreated, the second separation wafer W2 is further rotated to spin-dry the separation surface W2a. In addition, in the process A12, by cleaning the rear surface Wb of the second separation wafer W2 as well, the second separation wafer W2 can be further cleaned.

Subsequently, the second separation wafer W2 is transferred to the etching apparatus 40 by the wafer transfer device 50. In the etching apparatus 40, the separation surface W2a of the second separation wafer W2 is wet-etched by an etching liquid E, as shown in FIG. 10F (process A13 in FIG. 9).

In the process A13, while carrying on the rotation of the second separation wafer W2 by the spin chuck (not shown), the etching liquid E is supplied to a central portion of the separation surface W2a from the nozzle 210 disposed above the second separation wafer W2. The separation surface W2a is etched by this etching liquid E, and the peripheral modification layer M1 and the internal modification layer M2 remaining on the separation surface W2a are removed. In addition, in the scrub cleaning of the process A12, there is a likelihood that particles may be generated again as the peripheral modification layer M1 and the internal modification layer M2 are left. By the etching of the process A13, however, these particles are also removed.

Further, in the process A13, after the separation surface W2a is etched as described above, the supply of the etching liquid E from the nozzle 210 is stopped, and the separation surface W2a is cleaned with pure water. Then, by further rotating the second separation wafer W2, the separation surface W2a is spin-dried.

Thereafter, the second separation wafer W2 after being subjected to all the required processes is transferred to the transition device 30 by the wafer transfer device 50 and then transferred into the cassette Cw2 of the cassette placing table 10 by the wafer transfer device 22.

Meanwhile, the same processing is performed on the first separation wafer W1. That is, the first separation wafer W1 is transferred to the cleaning apparatus 41 by the wafer transfer device 70. In the cleaning apparatus 41, the separation surface W1a of the first separation wafer W1 is scrub-cleaned as shown in FIG. 10G (process A14 in FIG. 9). In the process A14, by supplying pure water while bringing the scrub cleaning tool 200 into contact with the separation surface W1a from above, the separation surface W1a is cleaned, the same as in the process A12. Further, the rear surface Sb opposite to the separation surface W1a may also be cleaned.

Next, the first separation wafer W1 is transferred to the etching apparatus 40 by the wafer transfer device 50. In the etching apparatus 40, the separation surface W1a of the first separation wafer W1 is wet-etched by the etching liquid E, as shown in FIG. 10H (process A15 in FIG. 9). In the process A15, the peripheral modification layer M1 and the internal modification layer M2 remaining on the separation surface W1a are removed. Further, in the process A15, the separation surface W1a is etched so that the first separation wafer W1 is thinned to have a required thickness.

Thereafter, the first separation wafer W1 after being subject to all the required processes is transferred to the transition device 30 by the wafer transfer device 50 and then transferred into the cassette Cw1 of the cassette placing table 10 by the wafer transfer device 22. At this time, when the cassette Ct is empty, the first separation wafer W1 may be transferred to the cassette Ct. In this way, the series of processes of the wafer processing in the wafer processing system 1 is completed.

According to the above-described exemplary embodiment, when separating the processing target wafer W by performing the processes A5 to A11 in the separating apparatus 61, the separation surfaces W1a and W2a are cleaned in the process A6. Accordingly, it is possible to reduce the risk of contamination of the inside of the apparatuses on the transfer paths of the separation wafers W1 and W2 carried out from the separating apparatus 61, contamination of the wafer transfer devices 22, 50, and 70 that transfer the separation wafers W1 and W2, contamination of the inside of the processing apparatus 40 and 41 in subsequent processes, and so forth. As a result, frequency of maintenance of the apparatuses may be reduced. In addition, adhesion of particles to another combined wafer (processing target wafer W) may also be suppressed.

Moreover, in the present exemplary embodiment, when the second separation wafer W2 is carried out in the processes A7 to A9, the transfer of the second separation wafer W2 to the transfer arm 71 is performed by using the delivery unit 180 and the transfer unit 112 without holding the separation surface W2a. Also, when the first separation wafer W1 is carried out in the processes A10 to A11, the transfer of the first separation wafer W1 to the transfer arm 71 is performed without holding the separation surface W1a. Therefore, the risk of the aforementioned contaminations may be further reduced.

In addition, since the separating apparatus 61 of the present exemplary embodiment is equipped with the pad cleaning unit 111 configured to clean the transfer pad 192, the transfer pad 192 may be cleaned appropriately. Therefore, it is possible to suppress transfer of the contamination of the transfer pad 192 to the second separation wafer W2. In addition, timing for the cleaning of the transfer pad 192 is not particularly limited.

Furthermore, although the processing target wafer W is separated in the wafer processing system 1 as described above, the second separation wafer W2 to be reused is subjected to grinding at the outside of the wafer processing system 1 to grind the separation surface W2a and remove the peripheral portion W2e. Thereafter, the separation surface W2a of the ground second separation wafer W2 is cleaned to remove particles, and then is etched to remove grinding marks. Afterwards, in case of reusing the second separation wafer W2 as a product wafer, for example, the separation surface W2a is polished (CMP). Meanwhile, in case of reusing the second separation wafer W2 as a support wafer for supporting a product wafer, for example, the second separation wafer W2 is used as it is without being subjected to any further processing.

In addition, the separation surface W1a of the first separation wafer W1 to be produced as a product is polished (CMP) at the outside of the wafer processing system 1. In the present exemplary embodiment, since the first separation wafer W1 is etched to the required thickness in the process A15 as stated above, it may be sufficient only to polish the separation surface W1a. However, if the first separation wafer W1 is not given the desired thickness in the process A15, for example, the separation surface W1a is ground to the required thickness at the outside the wafer processing system 1. Then, the cleaning of the separation surface W1a, the etching of the separation surface W1a, and the polishing of the separation surface W1a are sequentially performed on the ground first separation wafer W1.

Further, the wafer processing system 1 of the above-described exemplary embodiment may be further equipped with a grinding apparatus (not shown). For example, the grinding apparatus may be provided adjacent to the surface modifying apparatus 80 and the internal modifying apparatus 81 of the third processing block G3. In this case, the separation surface W2a of the second separation wafer W2 is ground in the grinding apparatus between the process A9 and the process A12, for example. Further, the separation surface W1a of the first separation wafer W1 is ground to the desired thickness in the grinding apparatus between the process A11 and the process A14, for example. Thereafter, the cleaning of the separation surface W1a in the process A14 and the etching of the separation surface W1a in the process A15 are sequentially performed on the ground first separation wafer W1.

Furthermore, in the separating apparatus 61 of the present exemplary embodiment, although the first holder 120 is moved up and down, the second holder 121 may be moved up and down, or both the first holder 120 and the second holder 121 may be moved up and down.

Figure 21:
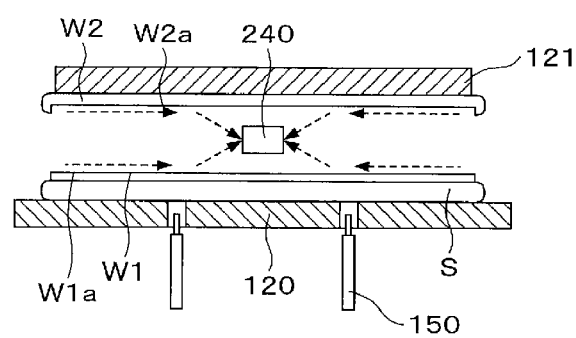
FIG. 21 is a side view illustrating a schematic configuration of a separation surface cleaning unit according to another exemplary embodiment.

In the separating apparatus 61 of the above-described exemplary embodiment, the separation surface cleaning unit 170 has the cleaning nozzle 171 and the suction nozzle 172. However, the configuration of the separation surface cleaning unit 170 is not limited thereto. By way of example, the separation surface cleaning unit 170 may have a suction nozzle 240, as shown in FIG. 21.

The suction nozzle 240 is configured to be moved in the horizontal direction and the vertical direction by a moving mechanism (not shown) and be advanced to and retreated from the space between the first holder 120 and the second holder 121. The suction nozzle 240 suctions the space between the first holder 120 and the second holder 121. Accordingly, dust or debris (particles) adhering to the separation surfaces W1a and W2a is removed, and the separation surfaces W1a and W2a are cleaned.

Figure 22:
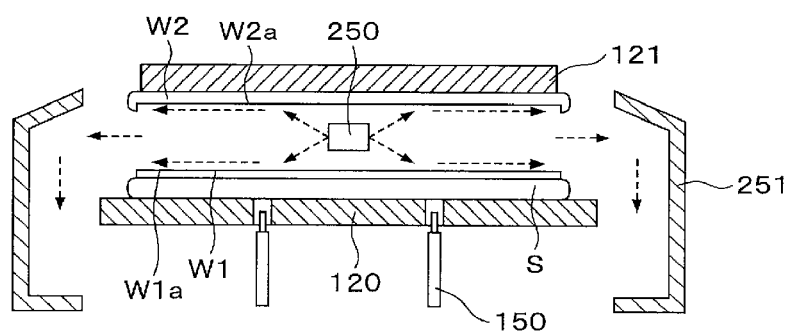
FIG. 22 is a side view illustrating a schematic configuration of a separation surface cleaning unit according to another exemplary embodiment.

Further, as shown in FIG. 22, for example, the separation surface cleaning unit 170 may include a cleaning nozzle 250 and a cup 251.

The cleaning nozzle 250 supplies, for example, air as a cleaning fluid. The cleaning nozzle 250 is provided with a plurality of supply openings (not shown) on a side surface thereof. Further, the cleaning nozzle 250 is configured to be moved in the horizontal direction and the vertical direction by a moving mechanism (not shown) and be advanced to and retreated from the space between the first holder 120 and the second holder 121. Further, although the air is used as the cleaning fluid in the present exemplary embodiment, the cleaning fluid is not limited thereto, and a cleaning liquid may be used, for example.

The cup 251 is disposed so as to surround the first holder 120 and the second holder 121 at an outside of the first holder 120 and the second holder 121 in the diametrical direction. This cup 251 is configured to be movable in the vertical direction by a moving mechanism (not shown).

In this case, in the process A6, the cleaning nozzle 250 is moved to be located in a central portion of the space between the first holder 120 and the second holder 121. Then, the air is supplied from the cleaning nozzle 250. At this time, the air is supplied from the entire circumference of the cleaning nozzle 250, and this air is supplied to the entire space between the first separation wafer W1 and the second separation wafer W2. The separation wafers W1 and W2 are cleaned by this air. Further, the supplied air is collected into the cup 251 and exhausted through an exhaust line (not shown) connected to the cup 251. In addition, when the cleaning fluid supplied from the cleaning nozzle 250 is a cleaning liquid, the cleaning liquid is collected into the cup 251 and drained through a drain line (not shown) connected to the cup 251.

Also in the present exemplary embodiment, the same effect as obtained in the above-described exemplary embodiment can be achieved. That is, since the separation wafers W1 and W2 are cleaned by the separating apparatus 61, the risk of contamination of the transfer devices and the processing apparatuses in the subsequent processes can be reduced. Additionally, the suction nozzle 172 configured to suck the air may be provided in the present exemplary embodiment as well, the same as in the above-described exemplary embodiment.

In the separating apparatus 61 of the above-described exemplary embodiments, the transfer pad 192 of the transfer unit 112 is configured to attract the rear surface Wb opposite to the separation surface W2a of the second separation wafer W2. However, the transfer pad 192 may be configured to attract and hold the separation surface W2a, as shown in FIG. 23A and FIG. 23B.

Figure 23A:
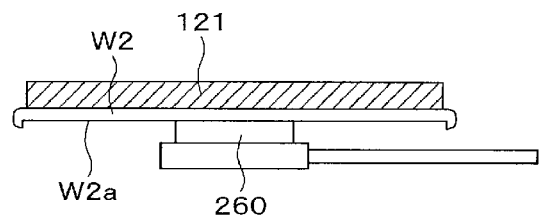
FIG. 23A and FIG. 23B are explanatory diagrams illustrating main processes of a second separation wafer cleaning processing according to another exemplary embodiment.

In this case, in the process A6, a portion of the separation surface W2a to be attracted to and hold by the transfer pad 192 (hereinafter, referred to as a holding portion) is cleaned in advance by using the scrub cleaning tool 260 such as the brush as a partial cleaning member, as shown in FIG. 23A. The scrub cleaning tool 260 is configured to be moved in the horizontal direction and the vertical direction by a moving mechanism (not shown) and be advanced to and retreated from the space between the first holder 120 and the second holder 121. Then, while bringing the scrub cleaning tool 260 into contact with the holding portion of the separation surface W2a from below, pure water, for example, is supplied from the scrub cleaning tool 260. Accordingly, the holding portion of the separation surface W2a is cleaned.

Further, in the present exemplary embodiment, although the scrub cleaning tool 260 is used as the partial cleaning member, the partial cleaning member is not limited thereto. By way of example, a cleaning nozzle configured to supply air, a cleaning liquid, a dual-fluid, or the like may be used as the partial cleaning member.

Figure 23B:
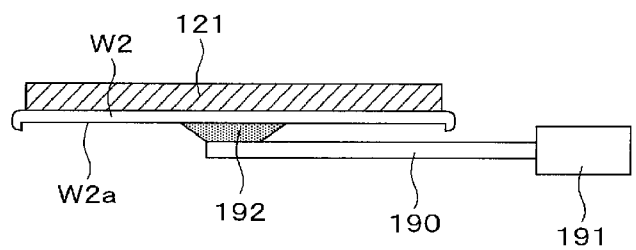

Next, as shown in FIG. 23B, the transfer pad 192 is moved to be placed under the second separation wafer W2 after the scrub cleaning tool 260 is retreated. Then, the holding portion of the separation surface W2a cleaned with the scrub cleaning tool 260 is attracted to and held by the transfer pad 192. Thereafter, the front and rear surfaces of the second separation wafer W2 are inverted by the transfer pad 192, and the second separation wafer W2 is transferred from the transfer pad 192 to the transfer arm 71 of the wafer transfer device 70.

In the present exemplary embodiment as well, the same effect as obtained in the above-described exemplary embodiments may be achieved. That is, since the transfer pad 192 attracts and holds the clean portion of the separation surface W2a, it is possible to suppress adhesion of particles to the transfer pad 192, thus enabling to suppress contamination of the inside of the apparatus. Further, deterioration of the transfer pad 192 in an early stage may also be suppressed. Besides, the delivery unit 180 can be omitted.

Figure 24A:
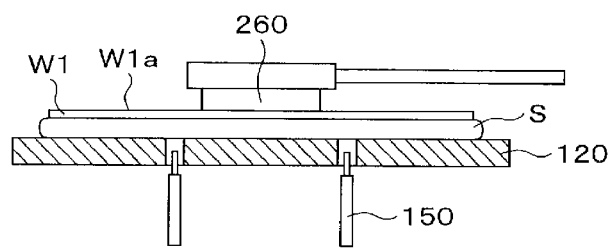
FIG. 24A and FIG. 24B are explanatory diagrams illustrating main processes of a first separation wafer cleaning processing according to another exemplary embodiment.
Figure 24B:
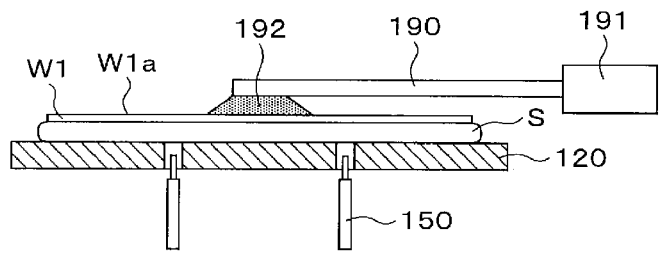
Figure 25:
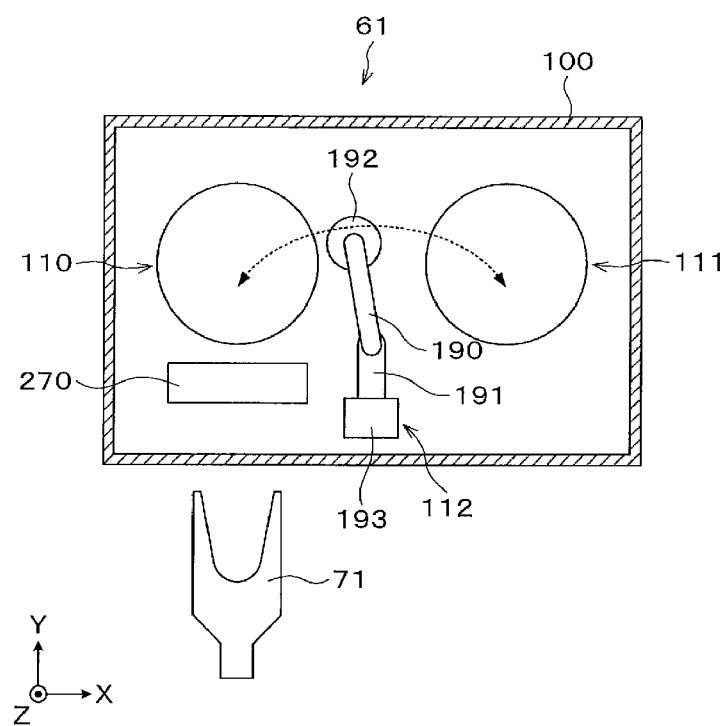
FIG. 25 is a plan view illustrating a schematic configuration of a separating apparatus according to another exemplary embodiment.

Moreover, as shown in FIG. 24A and FIG. 24B, the transfer pad 192 may attract and hold the separation surface W1a of the first separation wafer W1. In this case, in the process A6, a portion of the first separation surface W1a to be attracted to and held by the transfer pad 192 (hereinafter, referred to as a holding portion) is cleaned in advance by using the scrub cleaning tool 260, as shown in FIG. 24A. That is, while bringing the scrub cleaning tool 260 into contact with the holding portion of the separation surface W1a from above, pure water, for example, is supplied from the scrub cleaning tool 260. Accordingly, the holding portion of the separation surface W1a is cleaned.

Next, as shown in FIG. 24B, the holding portion of the separation surface Wa1 cleaned with the scrub cleaning tool 260 is attracted to and held by the transfer pad 192. Thereafter, the first separation wafer W1 is delivered from the transfer pad 192 to the transfer arm 71 of the wafer transfer device 70.

In the present exemplary embodiment as well, the same effect as obtained in the above-described exemplary embodiments may be acquired. That is, since the transfer pad 192 attracts and holds the clean portion of the separation surface W1a, occurrence of contamination may be suppressed. Besides, there is no need to invert the second separation wafer W2.

In the separating apparatus 61 according to the above-described exemplary embodiments, a cleaning mechanism 270 may be provided in addition to the separation processing unit 110, the pad cleaning unit 111 and the transfer unit 112. The cleaning mechanism 270 is configured to clean the separation surface W1a of the first separation wafer W1 or the separation surface W2a of the second separation wafer W2 held by the transfer unit 112.

The configuration of the cleaning mechanism 270 is not particularly limited. The cleaning mechanism 270 may include, for example, a cleaning tool such as a stone cleaning tool (not shown) or a brush cleaning tool (not shown), and may clean the separation surface W1a or W1b by bringing the cleaning tool into contact with the separation surface W1a or W2a. Alternatively, the cleaning mechanism 270 may perform the cleaning by supplying air, a cleaning liquid, a dual-fluid, or the like to the separation surfaces W1a and W2a.

In the present exemplary embodiment as well, the same effect as obtained in the above-described exemplary embodiments may be achieved. That is, since the separation surfaces W1a and W2a are cleaned in the separating apparatus 61, the risk of contamination of the transfer devices and the processing apparatuses in the subsequent processes may be reduced. In the above-described exemplary embodiments, the separation surfaces W1a and W2a are cleaned between the first holder 120 and the second holder 121. However, the cleaning may be performed by using the cleaning mechanism 270 additionally, or by using the cleaning mechanism 270 instead.

The scrub cleaning of the separation surface W1a or the separation surface W2a performed in the cleaning apparatus 41 may be performed in the separating apparatus 61 of the above-described exemplary embodiments. That is, the separating apparatus 61 and the cleaning apparatus 41 may be integrated, and the cleaning apparatus 41 may be omitted from the wafer processing system 1.

Figure 26:
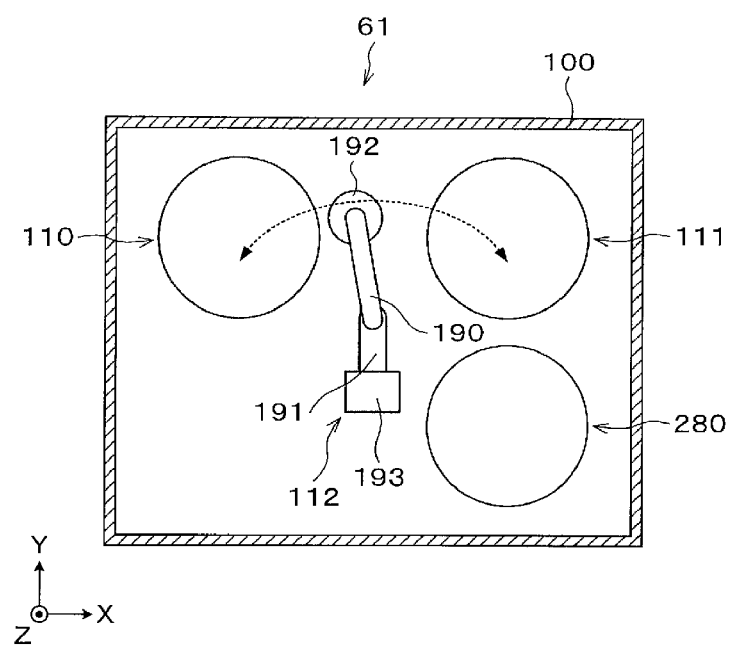
FIG. 26 is a plan view illustrating a schematic configuration of a separating apparatus according to another exemplary embodiment.

In such a case, as shown in FIG. 26, the separating apparatus 61 is equipped with a scrub cleaning unit 280 in addition to the separation processing unit 110, the pad cleaning unit 111, and the transfer unit 112. The scrub cleaning unit 280 has the same configuration as the cleaning apparatus 41 and cleans the separation surface W1a or the separation surface W2a by using the scrub cleaning tool 200. Transfer of the first separation wafer W1 and the second separation wafer W2 between the separation processing unit 110 and the scrub cleaning unit 280 are carried out by the transfer unit 112.

In the separation processing unit 110, after the separation of the processing target wafer W in the process A5 and the cleaning of the separation surfaces W1a and W2a in the process A6 are performed, the first separation wafer W1 and the second separation wafer W2 are respectively transferred to the scrub cleaning unit 280 by the transfer unit 112. In the scrub cleaning unit 280, each of the separation surfaces W1a and W2a is scrub cleaned. Thereafter, the first separation wafer W1 and the second separation wafer W2 are respectively carried out from the separating apparatus 61 by the wafer transfer device 70. Further, the separation surfaces W1a and W2a may be cleaned in the pad cleaning unit 111.

In the present exemplary embodiment as well, the same effect as obtained in the above-described exemplary embodiments may be achieved.

In the separating apparatus 61 according to the above-described exemplary embodiments, the second holder 121 attracts and holds the portion of the processing target wafer W at the inner side than the peripheral modification layer M1 formed in the processing target wafer W. However, the attraction surface of the processing target wafer W attracted and held by the second holder 121 is not limited thereto. For example, the second holder 121 may attract and hold the entire surface of the processing target wafer W.

In the wafer processing system 1 of the above-described exemplary embodiments, when the processing target wafer W is separated in the process A5, the peripheral portion We is removed from the first separation wafer W1. However, the way how to separate the processing target wafer W is not limited thereto. By way of example, the processing target wafer W may be separated into the first separation wafer W1 and the second separation wafer W2 after the peripheral portion We is removed.

In addition, in the wafer processing system 1 of the above-described exemplary embodiments, the processing target wafer W is separated starting from the peripheral modification layer M1 and the internal modification layer M2 in the process A5. However, the starting point for the separation of the processing target wafer W may not be limited thereto. As an example, a modification layer may be formed by radiating laser light to an inside of the oxide film Fw or Fs along the entire surface thereof, and the processing target wafer W may be separated starting from this modification layer. As another example, in the processing target wafer W before being processed in the wafer processing system 1, an oxide film (not shown) may be formed between the processing target wafer W and the device layer D, a modification layer may be formed by radiating laser light to an inside of the oxide film along the entire surface thereof, and the processing target wafer W may be separated starting from this modification layer. As still another example, an adhesive layer (not shown) may also be formed at the interface between the processing target wafer W and the support wafer S, a modification layer may be formed by radiating laser light to an inside of this adhesive layer along the entire surface thereof, and the processing target wafer W may be separated starting from this modification layer.

In the wafer processing system 1 of the above-described exemplary embodiments, although the non-bonding region Ab is formed by modifying the outer peripheral portion De of the device layer D in the process A2, the non-bonding region Ab may be formed at the outside of the wafer processing system 1. For example, before the processing target wafer W and the support wafer S are bonded, a processing of reducing bonding strength for the front surface Sa of the support wafer S is performed on an outer periphery of the oxide film Fw. Specifically, a surface layer of the outer periphery may be removed by polishing, wet-etching, or the like. Alternatively, a surface of the outer periphery may be hydrophobized or roughened with laser.

It should be noted that the above-described exemplary embodiment is illustrative in all aspects and is not anyway limiting. The above-described exemplary embodiment may be omitted, replaced and modified in various ways without departing from the scope and the spirit of claims.

According to the present exemplary embodiment, it is possible to appropriately separate the processing target object into the first separation body and the second separation body.

We claim:

1. A separating apparatus configured to separate a processing target object into a first separation body and a second separation body, the separating apparatus comprising:
    a first holder configured to hold the first separation body;
    a second holder configured to hold the second separation body;
    a moving unit configured to move the first holder and the second holder relatively to each other; and
    a suction nozzle configured to suction a space between the first holder and the second holder, and configured to move within the space between the first holder and the second holder.

2. The separating apparatus of claim 1, further comprising:
    a transfer unit configured to hold and transfer the first separation body or the second separation body; and
    a cleaning mechanism configured to clean at least a separation surface of the first separation body or a separation surface of the second separation body held by the transfer unit.

3. The separating apparatus of claim 1, further comprising:
    a transfer unit configured to hold and transfer the first separation body or the second separation body; and
    a partial cleaning member configured to clean a holding portion of the first separation body or a holding portion of the second separation body held by the transfer unit.

4. The separating apparatus of claim 1, further comprising:
    a transfer unit configured to transfer the first separation body or the second separation body, the transfer unit having a transfer pad configured to attract and hold the first separation body or the second separation body; and
    a pad cleaning unit configured to clean the transfer pad.

5. The separating apparatus of claim 1, further comprising:
    a cleaning nozzle configured to supply a cleaning fluid into the space between the first holder and the second holder, and configured to move within the space between the first separation body and the second separation body,
    wherein the suction nozzle is configured to suck the cleaning fluid supplied from the cleaning nozzle.

6. The separating apparatus of claim 1, further comprising:
    a cleaning nozzle configured to supply a cleaning fluid into the space between the first holder and the second holder, and configured to move within the space between the first separation body and the second separation body; and
    a cup disposed to surround the first holder and the second holder and configured to collect the cleaning fluid supplied from the cleaning nozzle.

7. The separating apparatus of claim 1, further comprising:
    a scrub cleaning unit configured to scrub-clean a separation surface of the first separation body and a separation surface of the second separation body.

8. A separating method of separating a processing target object into a first separation body and a second separation body, the separating method comprising:
    moving the first separation body held by a first holder and the second separation body held by a second holder relatively to each other to separate the first separation body and the second separation body; and
    suctioning a space between the first holder and the second holder by a suction nozzle,
    wherein the suction nozzle is configured to move within the space between the first holder and the second holder.

9. The separating method of claim 8,
    wherein the first separation body or the second separation body is held and transferred by a transfer unit, and
    at least a separation surface of the first separation body or a separation surface of the second separation body held by the transfer unit is cleaned.

10. The separating method of claim 8,
    wherein the first separation body or the second separation body is held and transferred by a transfer unit, and
    a holding portion of the first separation body or a holding portion of the second separation body held by the transfer unit is cleaned.

11. The separating method of claim 8,
    wherein the first separation body or the second separation body is transferred while being attracted to and held by a transfer pad of a transfer unit, and
    the transfer pad is cleaned.

12. The separating method of claim 8, further comprising:
    supplying a cleaning fluid from a cleaning nozzle into the space between the first holder and the second holder,
    wherein the cleaning nozzle is configured to move within the space between the first holder and the second holder, and
    wherein the cleaning fluid supplied from the cleaning nozzle is sucked from the suction nozzle.

13. The separating method of claim 8, further comprising:
    supplying a cleaning fluid from a cleaning nozzle into the space between the first holder and the second holder,
    wherein the cleaning nozzle is configured to move within the space between the first holder and the second holder,
    wherein a cup disposed to surround the first holder and the second holder is provided, and
    wherein the cleaning fluid supplied from the cleaning nozzle is collected into the cup.

14. The separating method of claim 8,
    wherein a separation surface of the first separation body and a separation surface of the second separation body are scrub-cleaned.

15. A separating apparatus configured to separate a processing target object into a first separation body and a second separation body, the separating apparatus comprising:
    a first holder configured to hold the first separation body;
    a second holder configured to hold the second separation body;
    a moving unit configured to move the first holder and the second holder relatively to each other; and
    a scrub cleaning tool configured to advance to a space between the first holder and the second holder and configured to scrub-clean at least a separation surface of the first separation body held by the first holder or a separation surface of the second separation body held by the second holder, and configured to retreat from the space.

16. A separating method of separating a processing target object into a first separation body and a second separation body, the separating method comprising:

moving the first separation body held by a first holder and the second separation body held by a second holder relatively to each other to separate the first separation body and the second separation body; and advancing a scrub cleaning tool into a space between the first separation body held by the first holder and the second separation body held by the second holder and scrub-cleaning at least a separation surface of the first separation body or a separation surface of the second separation body by the scrub cleaning tool, and retreating from the space between the first separation body and the second separation body.

* * * * *